United States Patent [19]

Karema et al.

[11] Patent Number: 5,191,331
[45] Date of Patent: Mar. 2, 1993

[54] SIGMA-DELTA MODULATOR FOR A D/A CONVERTER WITH PSEUDORANDOM JITTER SIGNAL INSERTION

[75] Inventors: Teppo Karema; Hannu Tenhunen; Tapani Ritoniemi, all of Tampere, Finland

[73] Assignees: Nokia Matkapuhelimet Oy, Salo; Fincitec Oy, Kemi, both of Finland

[21] Appl. No.: 818,522

[22] Filed: Jan. 9, 1992

[51] Int. Cl.⁵ ............................................. H03M 1/20
[52] U.S. Cl. ................................... 341/131; 341/143
[58] Field of Search ..................... 341/143, 131, 118

[56] References Cited

U.S. PATENT DOCUMENTS

| | | | |
|---|---|---|---|
| 4,528,551 | 7/1985 | Agrawal et al. | 341/143 |
| 4,811,019 | 3/1989 | Julstrom et al. | 341/143 |
| 4,827,343 | 5/1989 | Naimpally | 358/183 |
| 4,857,928 | 8/1989 | Gailus et al. | 341/143 |
| 4,968,987 | 11/1990 | Naka et al. | 341/143 |
| 5,010,347 | 4/1991 | Yukawa | 341/143 |
| 5,073,777 | 12/1991 | Fukuhara et al. | 341/131 |
| 5,073,778 | 12/1991 | Ueki et al. | 341/131 |

FOREIGN PATENT DOCUMENTS

| | | |
|---|---|---|
| 0338358 | 10/1989 | European Pat. Off. . |
| 136554 | 7/1979 | Fed. Rep. of Germany . |
| WO89/07368 | 8/1989 | PCT Int'l Appl. . |

*Primary Examiner*—Marc S. Hoff
*Attorney, Agent, or Firm*—Watson Cole Grindle & Watson

[57] ABSTRACT

The invention relates to a digital sigma-delta modulator for a D/A converter, comprising an integration stage or several cascaded integration stages and a feedback circuit for feedbacking the sign of the output signal of the last integration stage, delayed by one clock cycle and multiplied by a predetermined scaling coefficient, to each integration stage. To avoid limit cycle oscillation, the state of at least the least significant free bit in at least one integration stage is variable at random.

14 Claims, 1 Drawing Sheet

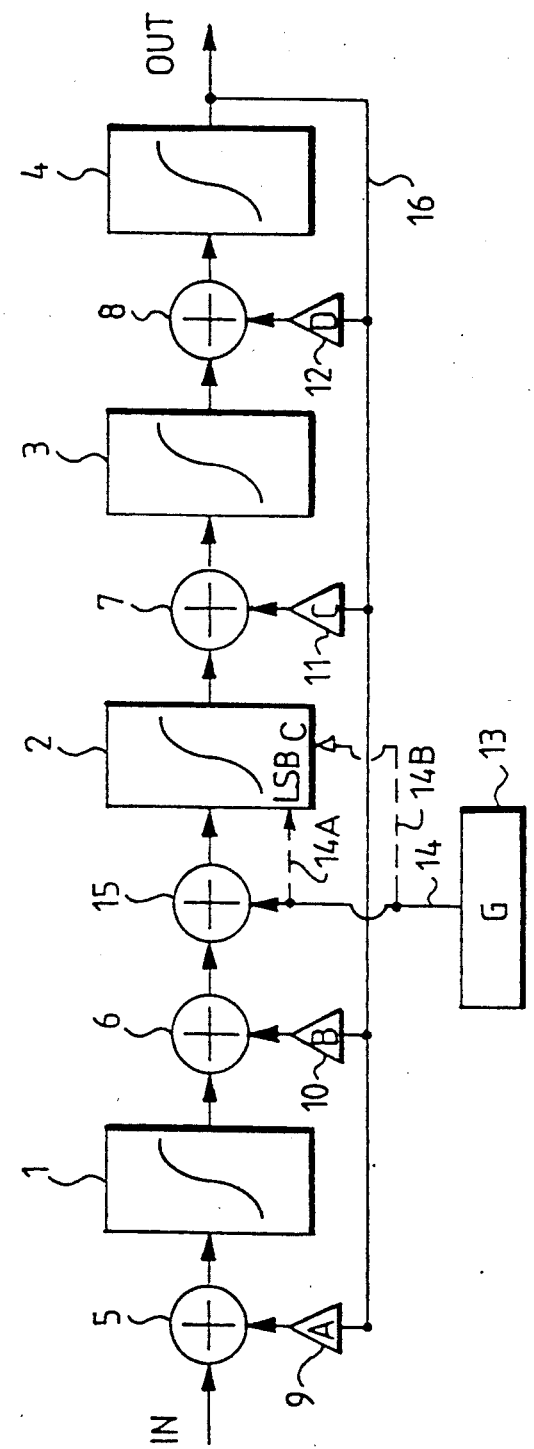

SIGMA-DELTA MODULATOR FOR A D/A CONVERTER WITH PSEUDORANDOM JITTER SIGNAL INSERTION

FIELD OF THE INVENTION

The invention relates to digital sigma-delta modulator for a D/A converter

BACKGROUND OF THE INVENTION

Digital signal processing requires converters for converting the signals of the surrounding analog world into digital form and then again from digital to analog form, that is, analog-to-digital (A/D) and digital-to-analog (D/A) converters. Oversampled converters are used in many (e.g. audio-) applications to improve performance. Among such oversampled converters, so-called sigma-delta converters enabling advantageous implementation technology have been paid plenty of attention. Sigma-delta converters are described e.g. in *Oversampled A/D and D/A Converters for VLSI System Integration* by T. Ritoniemi, V. Eerola, T. Karema and H. Tenhunen, Proc. IEEE ASIC Seminar and Exhibit, Sep. 1990, P8-7.1.-P8.7.12.

The sigma-delta D/A converter comprises three different stages: an interpolation filter, a noise shaper, i.e. a digital sigma-delta modulator, and a reconstruction filter. In the interpolation filter, the number of samples representing the signal is increased by digital filtration. In the sigma-delta modulator, incoming samples are approximated by one bit. In the reconstruction filter, a single-bit D/A conversion is performed, and the obtained analog signal is filtered by an analog filter to remove frequency components outside of the signal band (such as the quantization noise of the modulator).

The digital sigma-delta modulator comprises one or more cascaded integration stages. The sign of the output of the last integration stage, delayed by one sample and multiplied by a suitable scaling coefficient, is combined with the input signal of each integration stage. The scaling coefficients are selected so that the modulator is stable. The order of the sigma-delta modulator is determined by the number of the integration stages. By using a higher order modulator, the precision can be improved while the interpolation ratio remains unchanged.

A problem with prior art sigma-delta modulators is, however, that the spectrum of the modulator is not such as desired in all situations but the bit sequence generated at the output of the modulator easily starts to repeat the same bit pattern with resulting undesired frequency components, that is, limit cycle oscillation.

A similar phenomenon is known to occur in a conventional digital filter during zero-value input due to rounding or truncation noise (*Discrete-Time Signal Processing*, A.V. Oppenheimer and R.W. Schafer, Prentice Hall, 1989). The sigma-delta modulator is, however, a strongly non-linear system in which the feedback is established on the basis of the sign of the output signal, and the value feedbacked to the first integration stage is always higher than the value of the input signal. The sigma-delta modulator thus behaves in a completely different way than a conventional digital filter, which is a linear system. In the sigma-delta modulator, limit cycle oscillation may actually occur at all input values.

Limit cycle oscillation is also known to occur in the modulator of a first-order sigma-delta A/D converter (*Analog to Digital Conversion Using Sigma-Delta Modulation and Digital Signal Processing*, J.R. Fox and J.G. Garrison, Conference on Advanced Research in VLSI M.I.T., 1982. p. 101-112), in which the problem has been solved by combining a so-called jitter signal having a frequency outside of the signal band with the analog input signal of the single integration stage. Due to the added jitter signal, the input is always active, and no undesired frequencies occur at small input values. The jitter signal is filtered off in a decimation filter because its frequency is outside of the signal band. In addition, both signals to be combined are analog, and so they are easy to combine.

In the sigma-delta D/A converter, all signals are multi-bit digital signals, wherefore the combining of a jitter signal of a predetermined frequency with the input signal should be carried out similarly as with multi-bit digital signals. The multi-bit adder required for the purpose would limit the operating frequency of the modulator, increase the power consumption and require plenty of surface area on the silicon substrate when the modulator is realized as an integrated circuit.

DISCLOSURE OF THE INVENTION

The object of the invention is to provide a sigma-delta modulator which avoids disadvantageous limit cycle oscillations in an oversampled sigma-delta D/A converter without summing a multi-bit jitter signal to the input.

This is achieved by means of a sigma-delta modulator according to the invention, wherein the state of at least the least significant free bit in at least one integration stage is variable at random.

The jitter signal according to the invention, consisting of noise, randomly adds a positive number equal to the least significant bit of an integration stage to the input signal of the integration stage, as a result of which the repetition of the same bit pattern in the bit sequence of the output of the sigma-delta modulator is avoided, and thus the limit cycle oscillation is eliminated. Adding the jitter signal according to the invention does not cause problems in the sigma-delta modulator as the bit number of the integration stage is so high that noise equal to the least significant bit (LSB) does not appear in the modulator output. The noise added by the jitter signal appears within the frequency band of the signal only as a noise power divided by the interpolation ratio and covered by the quantization noise of the modulator.

When the noise is added only to the least significant bit(s) of the integration stage, the introduction of a multi-bit adder to the integration stage is avoided, as a result of which the operating frequency of the sigma-delta modulator is increased and the power consumption of the modulator and the surface area it requires on the silicon substrate are decreased as compared with the application of a jitter signal and method without modification in the modulator of the A/D converter. At simplest, the addition of the jitter signal according to the invention can be realized by leaving the least significant bit of a digital signal from a preceding integration stage unconnected to the subsequent integration stage and by connecting a single-bit jitter signal in place of it. Alternatively, the jitter signal can be connected to the carry input of the integration stage. In either case, the addition of the jitter signal does not require any modifications in the integration stage itself.

BRIEF DESCRIPTION OF THE DRAWING

In the following the invention will be described in greater detail by means of an illustrating embodiment with reference to the attached figure, which shows the block diagram of a sigma-delta modulator according to the invention.

PREFERRED EMBODIMENTS OF THE INVENTION

The digital sigma-delta modulator shown in the figure comprises four cascaded multi-bit integration stages 1, 2, 3 and 4 and adder means 5, 6, 7 and 8. The modulator contains a feedback which combines the sign of the output of the last integration stage 4, that is, the most significant bit, delayed by one sample and multiplied by proper scaling coefficients, to the input signal of each integration stage. A feedback signal 16 is multiplied in a multiplying means by a scaling coefficient A and then combined in the adder means 5 with the input signal of the modulator. Correspondingly, the adder means 6 combines the feedback signal 16 multiplied by a scaling coefficient B in a multiplying means 10 with the output signal of the first integration stage 1; the adder means 7 combines the feedback signal 16 multiplied by a scaling coefficient C in a multiplying means 11 with the output signal of the second integration stage 2; and the adder means 8 combines the feedback signal 16 multiplied by a scaling coefficient D in a multiplying means 12 to the output signal of the third integration stage 3. The input signal IN and all signals between the integration stages 1, 2, 3 and 4 are multi-bit digital signals. The bit number varies from one integration stage to another: e.g. the integration stage 1 is 24-bit, the integration stage 2 is 20-bit, the integration stage 3 is 16-bit and the integration stage 4 is 12-bit. All the blocks shown in the figure are controlled in synchronization by one and the same clock signal. To achieve stable operation, the ratio between the scaling coefficients is $A:B:C:D = 1:4:16:32$ in the preferred embodiment of the invention.

The operation and structure of the sigma-delta modulator of the type described above are obvious to those skilled in the art, and the different operational blocks of the modulator can be realized in many different ways. In practice, for example, the combining function represented by the adder means 5, 6, 7 and 8 in the attached figure can be included in the respective integration stages. Further, in practice, the multiplication functions represented by the multiplying means 9, 10, 11 and 12 can be realized e.g. by multiplying the output of the respective integration stage by a power of two, whereby a bit preceding the most significant sign bit is shifted downwards in the input of the next integration stage (to the position of the next less significant bit). Such different realizations of the different functions do not, however, affect the invention as such, but the invention can be applied to a digital sigma-delta modulator of any type.

A new feature in the sigma-delta modulator according to the invention is that the state of at least the least significant free bit in at least one integration stage is varied at random. This can be realized e.g. by adding a jitter signal consisting substantially of noise to at least the least significant bit of the input signal of the respective integration stage. For this purpose, in the modulator shown in the figure, an adder means 15 is positioned between the adder means 6 and the input of the second integration stage 2 for combining a pseudorandom jitter signal 14 generated by a random number generator 13 with the least significant free bit of the input signal. The jitter signal 14 may be any bit of a random number generated by the random number generator 13. Thus the random number generator 13 and the adder means 15 randomly adds to the input signal of the second integration stage 2 a positive number equal to the least significant bit of said input signal, which prevents the occurrence of limit cycle oscillation in the modulator.

Alternatively, the combining function realized by the adder 15 can be realized by connecting the jitter signal 14 in place of at least the least significant bit LSB of a digital signal applied from a preceding integration stage in the input of at least one integration stage, as shown by a dashed line 14A in the figure. Thus the adder 15 can be omitted.

Still another alternative is to realize the combining function performed by the adder 15 by connecting the jitter signal 14 to the carry input C of at least one integration stage, as shown by a dashed line 14B in the figure. Thus the adder 15 can be omitted.

The figure and the description related to it are also in other respects only intended to illustrate the invention. In its details, the sigma-delta modulator according to the invention may vary within the scope of the attached claims.

We claim:

1. A digital sigma-delta modulator for a D/A converter, comprising several cascaded integration stages and feedback means for feedbacking the sign of the output signal of the last integration stage, delayed by one clock cycle and multiplied by predetermined scaling coefficients, to each integration stage, wherein the state of the least significant bit in at least one integration stage subsequent to the first of the integration stages, is variable at random.

2. A digital sigma-delta modulator according to claim 1, comprising four integration stages, the ratio between the scaling coefficients of the first, the second, the third and the fourth integration stage being 1:4:16;32.

3. A digital sigma-delta modulator for a D/A converter, comprising several cascaded integration stages, feedback means for feedbacking the sign of the output signal of the last integration stage, delayed by one clock cycle and multiplied by predetermined scaling coefficients, to each integration stage, and means for combining a jitter signal consisting substantially of noise with the least significant bit in at least one integration stage subsequent to the first of the integration stages.

4. A digital sigma-delta modulator according to claim 3, wherein said jitter signal is a single-bit pseudorandom signal.

5. A digital sigma-delta modulator according to claim 3, comprising a random number generator, said jitter signal being formed by one bit of a random number generator by said random number generator.

6. A digital sigma-delta modulator according to claim 3, comprising four integration stages, the ratio between the scaling coefficients of the first, the second, the third and the fourth integration stage being 1:4:16:32.

7. A digital sigma-delta modulator for a D/A converter, comprising several cascaded integration stages, feedback means for feedbacking the sign of the output signal of the last integration stage, delayed by one clock cycle and multiplied by predetermined scaling coefficients, to each integration stage, and means for combining a jitter signal consisting substantially of noise in place of the least significant bit of a digital signal from a preceding integration stage in the input of at least one integration stage subsequent to the first of the integration stages.

8. A digital sigma-delta modulator according to claim 7, wherein said jitter signal is a single-bit pseudorandom signal.

9. A digital sigma-delta modulator according to claim 7, comprising a random number generator, said jitter signal being formed by one bit of a random number generated by said random number generator.

10. A digital sigma-delta modulator according to claim 7, comprising four integration stages, the ratio between the scaling coefficients of the first, the second, the third and the fourth integration stage being 1:4:16:32.

11. A digital sigma-delta modulator for a D/A converter, comprising several cascaded integration stages, feedback means for feedbacking the sign of the output signal of the last integration stage, delayed by one clock cycle and multiplied by predetermined scaling coefficients, to each integration stage, and means for inputting a jitter signal consisting substantially of noise to the carry input of at least one integration stage subsequent to the first of the integration stages.

12. A digital sigma-delta modulator according to claim 11, wherein said jitter signal is a signal-bit pseudorandom signal.

13. A digital sigma-delta modulator according to 11, comprising a random number generator, said jitter signal being formed by one bit of a random number generated by said random number generator.

14. A digital sigma-delta modulator according to claim 11, comprising four integration stages, the ratio between the scaling coefficients of the first, the second, the third and the fourth integration stage being 1:4:16:32.

* * * * *